United States Patent [19]

Liu

[11] Patent Number: 4,615,461
[45] Date of Patent: Oct. 7, 1986

[54] ACCESSORY CONTAINER STRUCTURE

[76] Inventor: Jackie Liu, 2nd Fl., No. 442, Chang Chuen Road, Taipei, Taiwan

[21] Appl. No.: 760,821

[22] Filed: Jul. 31, 1985

[51] Int. Cl.[4] ............................................. B65D 83/04
[52] U.S. Cl. ................................... 220/331; 220/345; 206/45.23
[58] Field of Search ............................ 206/345, 45.23; 220/331, 345, 346, 329, 306

[56] References Cited

U.S. PATENT DOCUMENTS

| | | | |
|---|---|---|---|
| 2,792,144 | 5/1957 | Mayer | 220/331 X |
| 3,422,988 | 1/1969 | La Franca | 220/331 X |
| 3,741,430 | 6/1973 | Bergh et al. | 220/331 X |
| 4,342,403 | 8/1982 | Badtke et al. | 220/345 |
| 4,402,423 | 9/1983 | Skowronski et al. | 220/345 |
| 4,420,079 | 12/1983 | Gliniorz et al. | 220/331 X |

Primary Examiner—Steven M. Pollard
Attorney, Agent, or Firm—Bacon & Thomas

[57] ABSTRACT

The present invention relates to an improved structure for an accessory container and in particular to one comprising an inverted U-shaped top cover having pimples mounted at the inner edge of the cover. The pimples may slide within the grooves of the container. The extreme end of each groove has an oval-shaped slot. The top cover can slide within the grooves of the container in which the grooves are positioned on the lateral sides of the container. With the slots and pimples defining a hinge, the top cover can be overturned angularly for 180 degrees and lay just directly below the container. The top cover has the advantage of preventing dust from contacting the accessory and at the same time, it can be disposed under the container. Hence, this assembly does not occupy much space. By providing an arrangement including dimples, pimples and grooves, the pimples of the top cover may slide within the grooves if the top cover is pushed in a planar direction by means of a pushing grip. The lateral sidewall of the container is marked with a measuring scale for measuring the length of the accessory.

1 Claim, 6 Drawing Figures

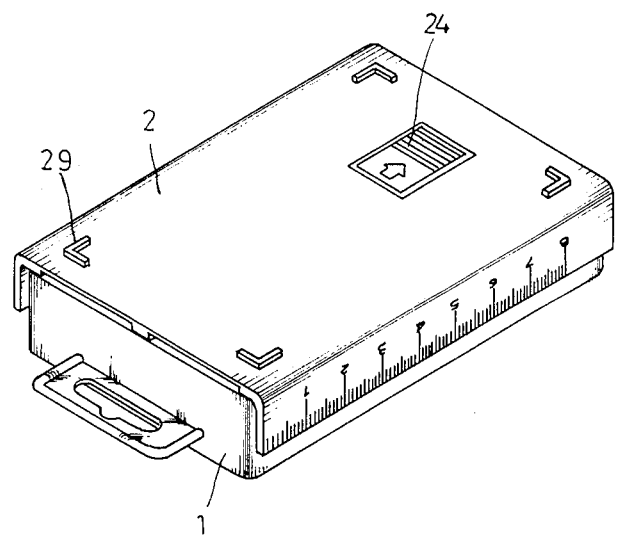
F I G.1

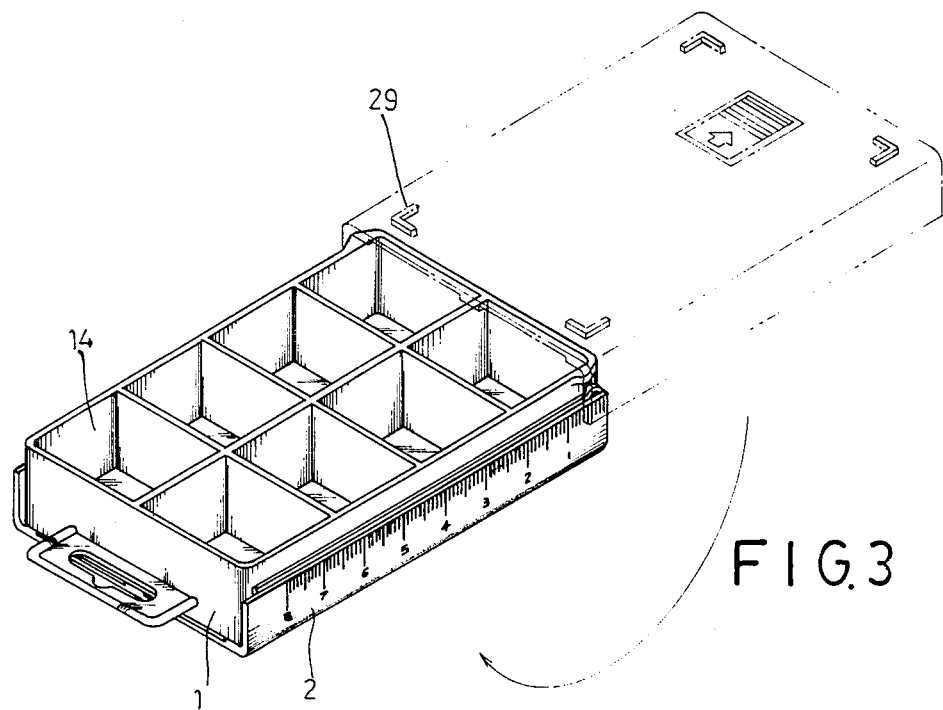
FIG.3
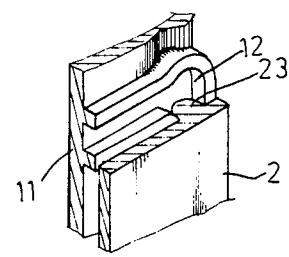
FIG.3-A

ACCESSORY CONTAINER STRUCTURE

BACKGROUND OF THE INVENTION

Presently, the use of an accessory container is quite common, which permits retrieving accessories in a easier way. Furthermore, by means of a designed partition, the accessories in the partition can easily be seen and this solves the problem of searching a particular accessory in a short time, such container being substantially used to keep small accessory items, such as electronic components, screws, nuts, nails, etc. Thus, this is not only convenient and time saving in searching an accessory, but also increasing working efficiency indirectly. Hence, such a container is very attractive.

Generally, there are containers without top covers and therefore, they possess the following stated drawbacks:

(1) For those containers without a top cover, the accessories in the container cannot be kept away from dust. As a result, the accessories are easily dust polluted. Further, the humidity and temperature of the environment will affect the accessories, i.e. causing the accessories to be rusted or damaged.

(2) For those containers with a top cover, such top cover is a detachable top cover which is loosely fitted on the top of the container. Although this type of container does not possess the above mentioned drawbacks, however it is required to lift up the top cover and leave it aside. In this manner, it will occupy a larger space, and there is a possibility of misplacing the top cover.

SUMMARY OF THE INVENTION

Accordingly, it is an object of this invention to provide an improved structure of an accessory container having a movable hinge at one end of top cover. When in use, the cover is pushed along the axis of the container until it is hinged at the end of the container within oval-shaped slots, the cover is then turned over angularly and lay directly below the container.

It is another object of this invention to provide an improved structure for an accessory container, whereas, by means of a top cover and container arranged in such a way that when the cover lays directly below the container, the cover is firmly fitted to the container and no sliding will occur.

It is also another object of this invention to provide an improved structure for an accessory container, wherein, the lateral sidewall of the cover is marked with measurement and the marks are engraved on the surface of a lateral side. When the cover lays directly below the bottom of container, the measurement, which is used for measuring the length of an accessory, and the marking is not easily rubbed off.

Upon further study of the specification and appended claims, further objects and advantages of this invention will become apparent to those skilled in the art.

BRIEF DESCRIPTION OF THE DRAWINGS

FIG. 1 is a perspective view of an improved structure for an accessory container embodying the present invention;

FIG. 2A is a partial view of the cover showing the pimple and protuberant arching as viewed in the direction of arrow A in FIG. 2.

FIG. 2B is a parital cross-sectional view taken on the line B—B of FIG. 2.

FIG. 3 is a perspective view of an improved structure for an accessory container illustrating the position of the cover when the present invention is in use.

FIG. 3A is a partial cutaway view depicting the pimple disposed within the oval-shaped slot of the cover.

DETAILED DESCRIPTION OF THE PREFERRED EMBODIMENTS

Figure 2:
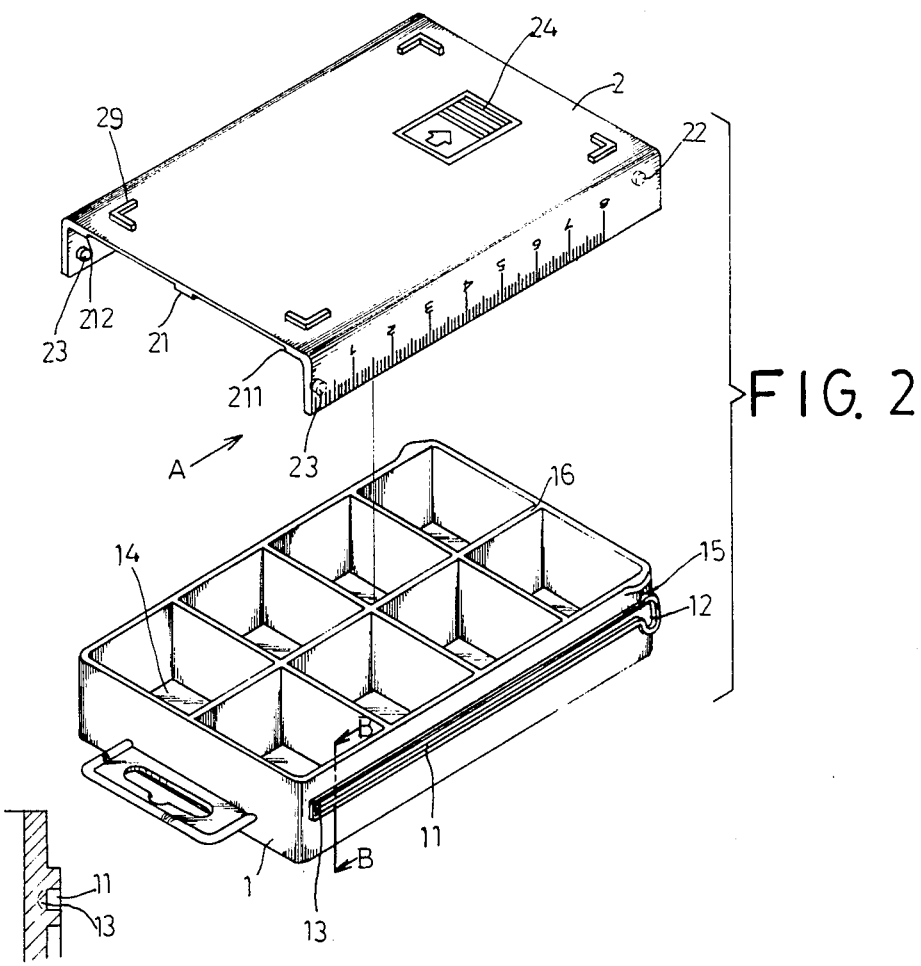
FIG. 2 is an exploded perspective assembly of the improved container illustrating the position and the combination of cover and container.

Referring now to the drawings, and in particular to FIGS. 1 and 2 thereof, the improved structure of an accessory container according to the present invention comprises a base container (1) in which a handle is rigidly fitted to one end of the front edge. The cavity of base container (1) is partitioned into a plurality of compartments (14) and both lateral side walls of base container (1) are provided with grooves (11), each extending from one end of the base container (1) to the other. At one end of each groove (11) there is an oval-shaped slot (12) which is a continuation of the groove (11), and at the other end of each groove (11) there is a dimple (13) disposed therein (as shown in FIG. 2-B). At the top edge of the oval-shaped slot (12), there is a semi-circular disc which forms an arch-shaped slot (15).

A top cover (2) having an inverted U-shaped edge, wherein the lateral side wall of cover is marked with measurement and a pushing grip (24) is formed on the far end of top cover (2), the four top corners of said cover are shouldered with L-shaped supports (29), at the inner lateral faces (212) (211) of cover (2) and the center face (21) are sliding surfaces which enable these surfaces to be smoothly displaced in a planar direction, (212) (211) (21) are directly corresponding to the edges of base container (1) and the central edge (16) of base container (1). Referring to FIG. 2, at the extreme of lateral side wall of top cover (2), is mounted a pimple (23) which is adapted to seat on dimple (13) of base container (1), and by means of pimple (23), the cover (2) is slidable along the direction of groove (11).

Referring to FIG. 3, when the pimple (23) of cover (2) slides to the oval-shaped slot (12) (as shown in FIG. 3a), the cover (2) will be angularly overturned about the axis. In this case the pimple (23) serves as an axis and consequently, the cover (2) lays just directly below the base container (1). Hence, this combination has achieved the object of this application as not occupying much space and having no risk of cover loss. The measurement on the lateral side wall can be used to measure the length of an accessory. If need to restore the container (1) and cover (2) to the original combination as shown in FIG. 1, just repeat the above procedures by turning the cover (2) from the underneath of base container (1) to a planar position. After that, displace the cover (2) horizontally towards the position of handle of said base container (1), whereby the top cover (2) is accurately fitted to said base container (1). It should be noted that the procedure of sliding is carried out by the three sliding surfaces of cover namely (21), (211), (212) which reduce the friction of coefficient and attain a better displacement effect.

When cover (2) is fully fitted on the base container (1), by means of pimple (23) of cover and protuberant arching (22) being exactly seated on the dimple (13) and semi-circular arch-shaped slot (15) respectively, said cover (2) is tightly fitted.

Thus, by means of this outstanding groove design in cooperation with the inverted U-shaped cover (2) and pimple (23) arrangement, the effect of anti-dust pollution can be achieved and the cover (2) can be fitted exactly underneath the base container (1). Hence it has the advantage of not occupying additional space. This arrangement has solved the drawbacks of prior art containers. The engraved measurement permits the measuring of the length of the accessories.

Although the present invention has been described with a certain degree of particularity, it is understood that the present disclosure is made by way of example only and that numerous changes in the detail and the combination and arrangement of parts may be resorted to without departing from the scope and spirit of the invention as hereinafter claimed.

I claim:

1. An improved accessory container structure comprising:

(a) a base container of generally rectangular configuration defined by a pair of transverse endwalls and a pair of longitudinal sidewalls;
(b) the interior of the container being partitioned into a plurality of compartments for receiving accessories therein;
(c) each longitudinal sidewall being provided with a groove means extending for substantially the entire length of the side wall;
(d) dimple means disposed at a front end of each groove means;
(e) a U-shaped cover including a pair of lateral edges and a top surface, with L-shaped support means provided on the top surface for permitting the cover to support itself and the container; and
(f) pimple means carried by each lateral edge of the cover for disposition within a corresponding groove means and engageable within the dimple means for permitting the cover to slide along the grooves and be angularly movable about an angle of 180°.

* * * * *